(12) United States Patent
Cheng et al.

(10) Patent No.: US 10,243,054 B1
(45) Date of Patent: Mar. 26, 2019

(54) INTEGRATING STANDARD-GATE AND EXTENDED-GATE NANOSHEET TRANSISTORS ON THE SAME SUBSTRATE

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/943,886

(22) Filed: Apr. 3, 2018

(51) Int. Cl.
| | |
|---|---|
| *H01L 21/00* | (2006.01) |
| *H01L 29/423* | (2006.01) |
| *H01L 29/06* | (2006.01) |
| *H01L 21/8234* | (2006.01) |
| *H01L 21/02* | (2006.01) |

(Continued)

(52) U.S. Cl.
CPC .. *H01L 29/42376* (2013.01); *H01L 21/02603* (2013.01); *H01L 21/82385* (2013.01); *H01L 21/823456* (2013.01); *H01L 29/0669* (2013.01); *H01L 29/401* (2013.01); *H01L 29/42368* (2013.01); *B82Y 40/00* (2013.01)

(58) Field of Classification Search
CPC ......... H01L 29/42376; H01L 21/02603; H01L 21/823456; H01L 21/82385; H01L 29/0669; H01L 29/401
See application file for complete search history.

(56) References Cited

U.S. PATENT DOCUMENTS

| | | |
|---|---|---|
| 8,753,942 B2 | 6/2014 | Kuhn et al. |
| 9,570,609 B2 | 2/2017 | Obradovic et al. |

(Continued)

OTHER PUBLICATIONS

Cheng et al., "Integrating Thin and Thick Gate Dielectric Nanosheet Transistors on Same Chip," U.S. Appl. No. 15/815,009, filed Nov. 16, 2017.

(Continued)

*Primary Examiner* — Nicholas J Tobergte
(74) *Attorney, Agent, or Firm* — Cantor Colburn LLP; Vazken Alexanian

(57) ABSTRACT

Embodiments of the invention are directed to fabrication operations for co-integrating standard-gate (SG) and extended-gate (EG) nanosheet/nanowire transistors on the same substrate. The SG and EG nanosheet/nanowire transistors share certain fabrication operations for certain features. For example, the processes to form the bottommost channel nanosheet, the bottommost sacrificial nanosheet, and the topmost channel nanosheet are the same for SG nanosheet transistors and the EG nanosheet transistors. Because the thickness of the sacrificial nanosheet needs to be thicker for EG nanosheet transistors, a thickness of the bottommost sacrificial nanosheet is selected to accommodate the design parameters of the EG nanosheet transistor. Because the thickness of the SG and the EG channel nanosheets do not need to be different, a thickness of the bottommost channel nanosheet and the topmost channel nanosheet can be selected to accommodate the design parameters of both the SG and the EG nanosheet transistors.

20 Claims, 15 Drawing Sheets

(51) Int. Cl.
*H01L 21/8238* (2006.01)
*H01L 29/40* (2006.01)
*B82Y 40/00* (2011.01)

(56) References Cited

U.S. PATENT DOCUMENTS

| | | | |
|---|---|---|---|
| 9,647,098 B2* | 5/2017 | Obradovic | H01L 29/7391 |
| 9,704,863 B1 | 7/2017 | Cheng et al. | |
| 9,818,616 B1 | 11/2017 | Jagannathan et al. | |
| 9,818,650 B2 | 11/2017 | Doris et al. | |
| 9,923,055 B1* | 3/2018 | Cheng | H01L 29/0665 |
| 9,935,014 B1 | 4/2018 | Cheng et al. | |
| 10,074,575 B1* | 9/2018 | Guillorn | H01L 21/823878 |
| 2015/0123215 A1 | 5/2015 | Obradovic et al. | |
| 2015/0295084 A1 | 10/2015 | Obradovic et al. | |
| 2016/0020305 A1* | 1/2016 | Obradovic | H01L 29/7391 |
| | | | 257/39 |
| 2017/0194143 A1 | 7/2017 | Balakrishnan et al. | |
| 2017/0250261 A1 | 8/2017 | Kim et al. | |
| 2017/0323941 A1 | 11/2017 | Obradovic et al. | |

OTHER PUBLICATIONS

Cheng et al., "Nanosheet Transistors Having Different Gate Dielectric Thicknesses on the Same Chip," U.S. Appl. No. 15/846,447, filed Dec. 19, 2017.
Cheng et al., "Nanosheet Transistors Having Different Gate Dielectric Thicknesses on the Same Chip," U.S. Appl. No. 15/846,461, filed Dec. 19, 2017.
List of IBM Patents or Patent Applications Treated as Related; Date Filed: Apr. 3, 2018, 2 pages.

* cited by examiner

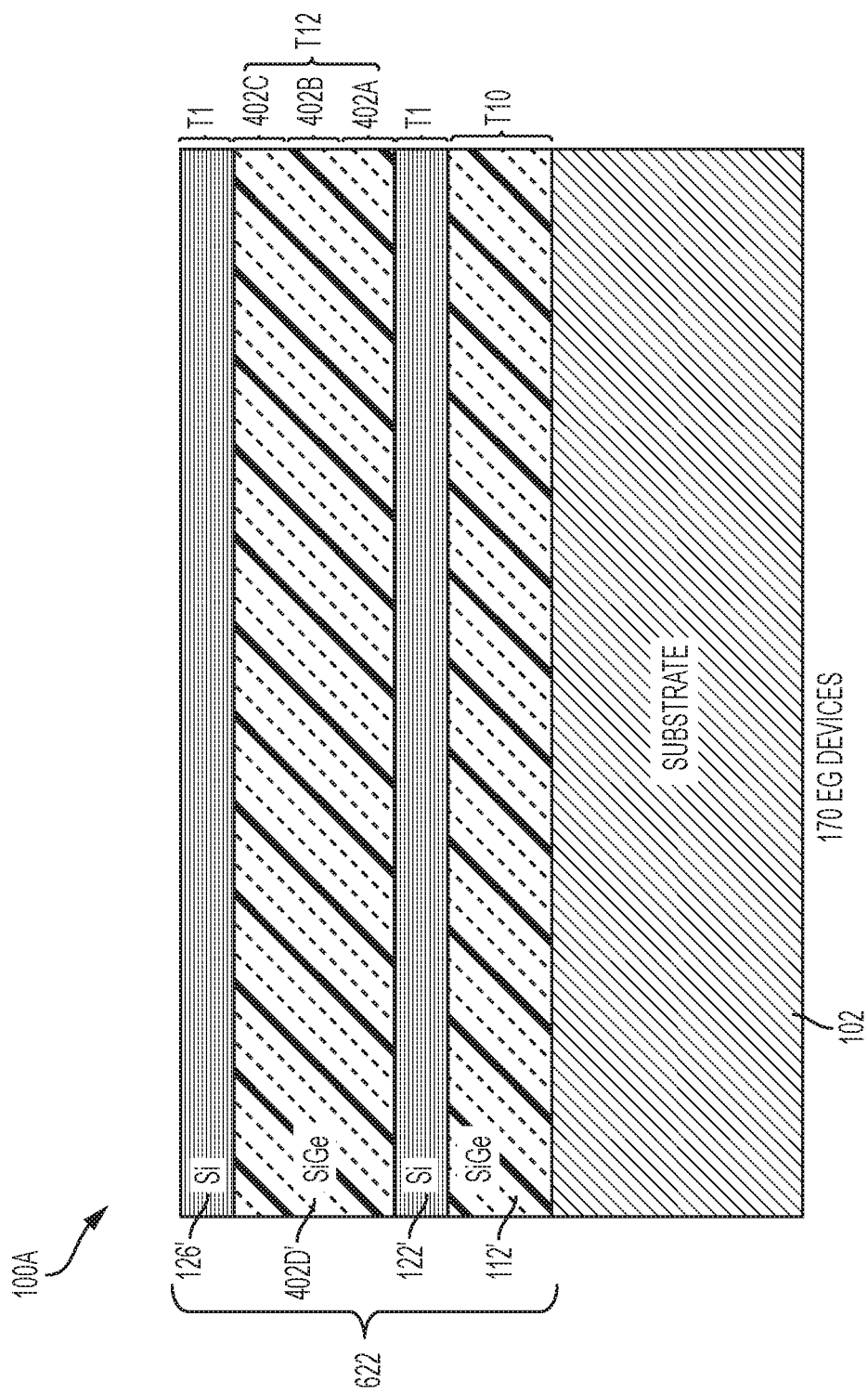

INTEGRATING STANDARD-GATE AND EXTENDED-GATE NANOSHEET TRANSISTORS ON THE SAME SUBSTRATE

BACKGROUND

The present invention relates in general to semiconductor devices and their fabrication. More specifically, the present invention relates to a co-integrated fabrication processes and resulting structures for forming standard-gate and extended-gate nanosheet/nanowire transistors on the same substrate.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects. In order to increase the maximum gate voltage of certain transistors, so-called extended gate (EG) nanosheet transistors have been developed that include a larger volume of gate metal and/or a thicker gate oxide than so-called standard-gate (SG) nanosheet transistors.

SUMMARY

Embodiments of the invention are directed to a method of fabricating semiconductor devices. A non-limiting example of the method includes performing fabrication operations to form nanosheet field effect transistor devices on a substrate. The fabrication operations include forming a first nanosheet transistor device and a second nanosheet transistor device on a substrate. Forming the first nanosheet transistor includes forming a first sacrificial nanosheet over a first region of a substrate, the first sacrificial nanosheet having a first sacrificial nanosheet thickness dimension. A first channel nanosheet is formed over the first sacrificial nanosheet and above the first region of the substrate, the first channel nanosheet having a first channel nanosheet thickness dimension. A second sacrificial nanosheet is formed over a first region of the first channel nanosheet and above the first region of the substrate, the second sacrificial nanosheet having a second sacrificial nanosheet thickness dimension. A second channel nanosheet is formed over a first region of the second sacrificial nanosheet and above the first region of the substrate, the second channel nanosheet having a second channel nanosheet thickness dimension. A third sacrificial nanosheet is formed over a first region of the second channel nanosheet and above the first region of the substrate, the third sacrificial nanosheet having a third sacrificial nanosheet thickness dimension. A third channel nanosheet is formed over a first region of the third sacrificial nanosheet and above the first region of the substrate, the third channel nanosheet having a third channel nanosheet thickness dimension. Forming the second nanosheet transistor includes forming the first sacrificial nanosheet over a second region of the substrate, the first sacrificial nanosheet having the first sacrificial nanosheet thickness dimension. The first channel nanosheet is formed over the first sacrificial nanosheet and above the second region of the substrate, the first channel nanosheet having the first channel nanosheet thickness dimension. A fourth sacrificial nanosheet is formed over a second region of the first channel nanosheet and above the second region of the substrate, the fourth sacrificial nanosheet having a second sacrificial nanosheet thickness dimension. The third channel nanosheet is formed over the second sacrificial nanosheet and above the second region of the substrate, the second channel nanosheet having a second channel nanosheet thickness dimension.

Embodiments of the invention are directed to a method of fabricating semiconductor devices. A non-limiting example of the method includes performing fabrication operations to form nanosheet field effect transistor devices on a substrate. The fabrication operations include forming a first nanosheet transistor device and a second nanosheet transistor device on a substrate. Forming the first nanosheet transistor includes forming a first sacrificial nanosheet over a first region of a substrate, the first sacrificial nanosheet having a first sacrificial nanosheet thickness dimension. A first channel nanosheet is formed over the first sacrificial nanosheet and above the first region of the substrate, the first channel nanosheet having a first channel nanosheet thickness dimension. A second sacrificial nanosheet is formed over a first region of the first channel nanosheet and above the first region of the substrate, the second sacrificial nanosheet having a second sacrificial nanosheet thickness dimension. A second channel nanosheet is formed over a first region of the second sacrificial nanosheet and above the first region of the substrate, the second channel nanosheet having a second channel nanosheet thickness dimension. A third sacrificial nanosheet is formed over a first region of the second channel nanosheet and above the first region of the substrate, the third sacrificial nanosheet having a third sacrificial nanosheet thickness dimension. A third channel nanosheet is formed over a first region of the third sacrificial nanosheet and above the first region of the substrate, the third channel nanosheet having a third channel nanosheet thickness dimension. The second sacrificial nanosheet, the third sacrificial nanosheet, and the portion of the first sacrificial nanosheet that is above the first region of the nanosheet are removed. A first gate oxide is formed in the spaces that were occupied by the second sacrificial nanosheet and the portion of the first sacrificial nanosheet that is above the first region of the substrate, the first gate oxide having a first gate oxide thickness dimension. Forming the second nanosheet transistor includes forming the first sacrificial nanosheet over a second region of the substrate, the first sacrificial nanosheet having the first sacrificial nanosheet thickness dimension. The first channel nanosheet is formed over the first sacrificial nanosheet and above the second region of the substrate, the first channel nanosheet having the first channel nanosheet thickness dimension. A fourth sacrificial nanosheet is formed over a second region of the first channel nanosheet and above the second region of the substrate, the fourth sacrificial nanosheet having a second sacrificial nanosheet thickness dimension. The third channel nanosheet is formed over the second sacrificial nanosheet and above the second region of the substrate, the second channel nanosheet having a second channel nanosheet thickness dimension. The fourth sacrificial nanosheet and the portion of the first sacrificial nanosheet that is above the second region of the nanosheet are removed. A second gate oxide is formed in the spaces that were occupied by the fourth sacrificial nanosheet and the portion of the first sacrificial nanosheet that was over the second region of the substrate, the second gate oxide having a first gate oxide thickness dimension.

Embodiments of the invention are directed to a set of nanosheet field effect transistor devices formed on a substrate. The nanosheet field effect transistor devices include a first nanosheet transistor device and a second nanosheet transistor device formed on the substrate. The first nanosheet transistor includes a first plurality of channel nanosheets that include a bottommost first channel nanosheet and a topmost second channel nanosheet. The first nanosheet transistor further includes a first gate region having a first gate dielectric and a first gate metal formed therein, the first gate region having a first gate region thickness dimension. The first nanosheet transistor further includes a second gate region having a second gate dielectric and a second gate metal formed therein, the second gate region having a second gate region thickness dimension. The second nanosheet transistor includes a second plurality of channel nanosheets that include a bottommost third channel nanosheet and a topmost fourth channel nanosheet. The second nanosheet transistor further includes a third gate region having a third gate dielectric and a first gate metal formed therein, the first gate region having a first gate region thickness dimension. The second nanosheet transistor further includes a fourth gate region having a fourth gate dielectric and a fourth gate metal formed therein, the fourth gate region having a fourth gate region thickness dimension. The fourth gate region thickness dimension is greater than the second gate region thickness dimension, and the second gate dielectric thickness dimension is greater than the first gate dielectric thickness dimension.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-13 depict cross-sectional views of a section of a substrate/wafer after various fabrication operations to form SG nanosheet transistor devices and EG nanosheet transistor devices thereon according to embodiments of the invention, in which:

FIG. 2 depicts a cross-sectional view of semiconductor structures after initial fabrication operations for forming SG nano sheet transistor devices and EG nanosheet transistor devices on the same substrate according to embodiments of the invention;

FIG. 3 depicts a cross-sectional view of semiconductor structures after fabrication operations for forming SG nanosheet transistor devices and EG nanosheet transistor devices on the same substrate according to embodiments of the invention;

FIG. 4 depicts a cross-sectional view of semiconductor structures after fabrication operations for forming SG nanosheet transistor devices and EG nanosheet transistor devices on the same substrate according to embodiments of the invention;

FIG. 5 depicts a cross-sectional view of semiconductor structures after fabrication operations for forming SG nanosheet transistor devices and EG nanosheet transistor devices on the same substrate according to embodiments of the invention;

FIG. 6C depicts a cross-sectional view of the semiconductor structures shown in FIG. 6A rotated clockwise by 90 degrees;

FIG. 7 depicts a cross-sectional view of semiconductor structures after fabrication operations for forming SG nanosheet transistor devices and EG nanosheet transistor devices on the same substrate according to embodiments of the invention;

FIG. 8 depicts a cross-sectional view of semiconductor structures after fabrication operations for forming SG nanosheet transistor devices and EG nanosheet transistor devices on the same substrate according to embodiments of the invention;

FIG. 9 depicts a cross-sectional view of semiconductor structures after fabrication operations for forming SG nanosheet transistor devices and EG nanosheet transistor devices on the same substrate according to embodiments of the invention;

FIG. 10 depicts a cross-sectional view of semiconductor structures after fabrication operations for forming SG nanosheet transistor devices and EG nanosheet transistor devices on the same substrate according to embodiments of the invention;

FIG. 11 depicts a cross-sectional view of semiconductor structures after fabrication operations for forming SG nanosheet transistor devices and EG nanosheet transistor devices on the same substrate according to embodiments of the invention;

FIG. 12 depicts a cross-sectional view of semiconductor structures after fabrication operations for forming SG nanosheet transistor devices and EG nanosheet transistor devices on the same substrate according to embodiments of the invention; and FIG. 13 depicts a cross-sectional view of semiconductor structures after fabrication operations for forming SG nanosheet transistor devices and EG nanosheet transistor devices on the same substrate according to embodiments of the invention.

DETAILED DESCRIPTION

Figure 1:
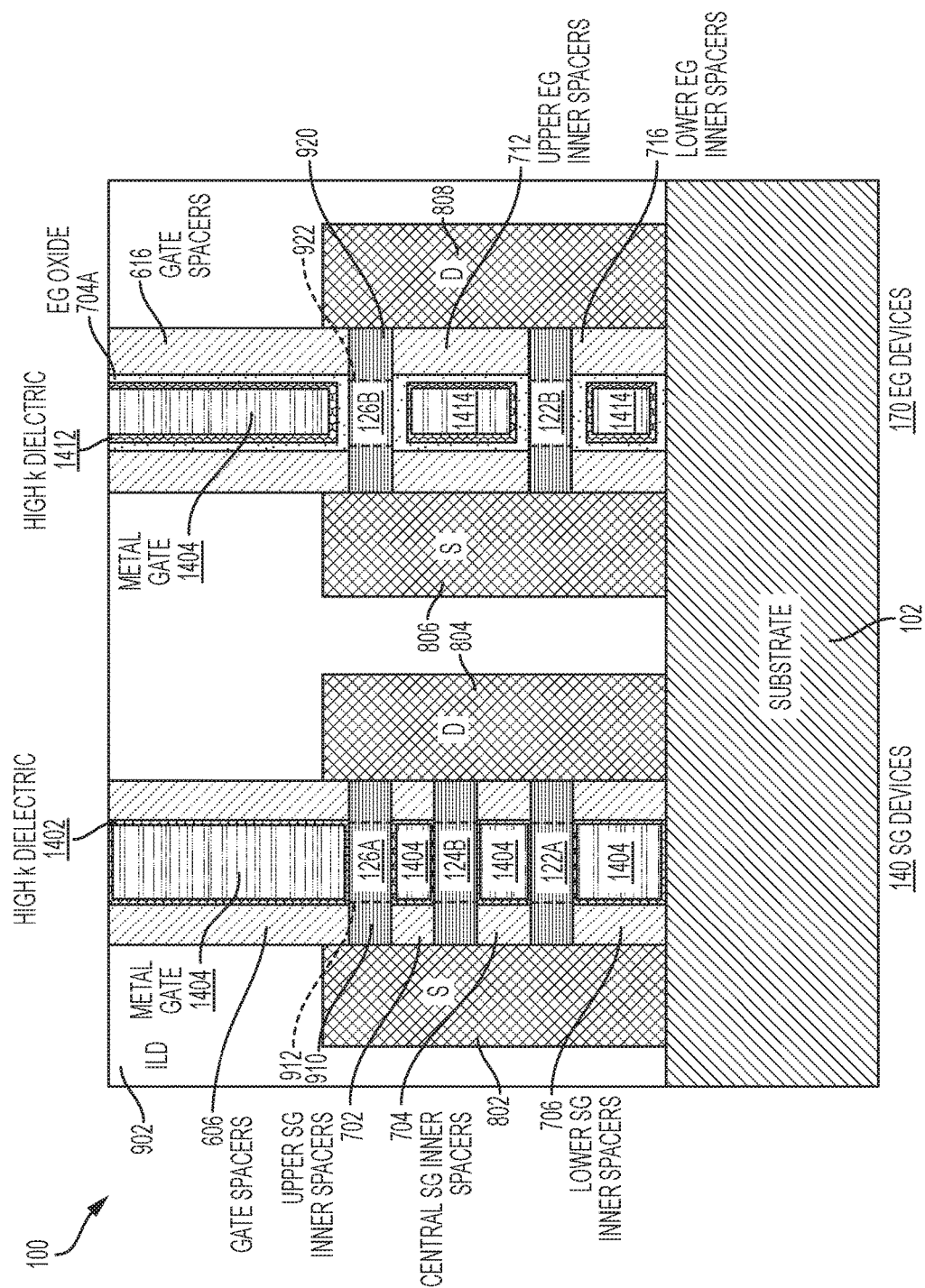
FIG. 1 depicts a cross-sectional view of a section of a substrate/wafer having standard-gate (SG) nanosheet transistor devices and extended-gate (EG) nanosheet transistor devices formed thereon according to known fabrication methodologies and resulting structures.

It is understood in advance that although this invention includes a detailed description of exemplary standard-gate (SG) and extended-gate (EG) GAA nanosheet FET architectures having silicon (Si) channels, embodiments of the invention are not limited to the particular FET architectures or materials described in this specification. Rather, embodiments of the present invention are capable of being implemented in conjunction with any other type of nanosheet/nanowire FET architecture or materials now known or later developed. Additionally, in this detailed description and the claims, the terms nanosheet and nanowire are treated as synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-type FET can be SiGe or Si, and the sacrificial nanosheet can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a broad range of applications. For example, some applications use so-called standard-gate (SG) transistors configured to tolerate a maximum gate/threshold voltage ($V_T$) at a predetermined SG level. For some applications (e.g., input/output (I/O) circuitry), transistors need to tolerate a $V_T$ that is higher than SG $V_T$ levels. In order to increase the maximum $V_T$ of certain transistors, so-called extended gate (EG) nanosheet transistors have been developed that include a larger volume of gate metal and/or a thicker gate oxide than so-called SG nanosheet transistors. Accordingly, it is necessary to fabricate semiconductor wafers having both SG (thin gate oxide) and EG (thick gate oxide) nanosheet transistors on the same substrate.

However, it is difficult to extend current SG nanosheet/nanowire transistor fabrication processes to support the direct fabrication of both SG and EG nanosheet transistors on the same substrate for a variety of reasons. For example, because of the relatively small space (e.g., about 5 nm to about 15 nm) provided between the channel nanosheets in standard SG nanosheet transistor fabrication, there is insufficient room for the larger volume of gate metal and/or the thicker gate oxide that are required for EG nanosheet transistors. In a known SG and EG nanosheet transistor integration method, all of the nanosheet stacks are completely removed in the EG area of the wafer, and new EG-specific channel nanosheets are formed, which results in a more complex and costly fabrication processes.

Turning now to an overview of aspects of the invention, embodiments of the invention provide fabrication operations and resulting structures for co-integrating SG and EG nanosheet/nanowire transistors on the same substrate. In the examples provided herein, it is assumed that three channel nanosheets (bottommost, central, and topmost) and three sacrificial channel nanosheets (bottommost, central, and topmost) are used to fabricate the SG nanosheet transistor, and two channel nanosheets (bottommost and topmost) and two sacrificial channel nanosheets (bottommost and topmost) are used to fabricate the EG nanosheet transistor. However, it will be apparent to persons skilled in the relevant arts that the examples described herein can be applied to more or fewer channel nanosheets and sacrificial nanosheets.

In embodiments of the invention, the SG and EG nanosheet/nanowire transistors are designed to share certain fabrication operations for certain features. For example, the processes to form the bottommost channel nanosheet, the bottommost sacrificial nanosheet, and the topmost channel nanosheet are the same for SG nanosheet transistors and the EG nanosheet transistors. In embodiments of the invention, because the thickness dimension of the sacrificial nanosheet needs to be thicker for EG nanosheet transistors, a thickness dimension of the bottommost sacrificial nanosheet is selected to accommodate the design parameters of the EG nanosheet transistor. Accordingly, in embodiments of the invention, the thickness of the bottommost sacrificial SG channel will be greater than is conventionally provided in known SG nanosheet transistors. In embodiments of the invention, because the thickness dimension of the channel nanosheet does not need to be different for EG nanosheet transistors, a thickness dimension of the bottommost channel nanosheet and the topmost channel nanosheet can be selected to accommodate the design parameters of both the SG and the EG nanosheet transistors.

Additionally, in embodiments of the invention, the topmost EG sacrificial nanosheet has a lower region, a central region, and an upper region. In embodiments of the invention, the processes to form the central SG sacrificial channel nanosheet and the lower region of the topmost EG sacrificial nanosheet are the same, and the processes to form the topmost EG sacrificial nanosheet and the upper region of the topmost EG sacrificial nanosheet are the same.

In embodiments of the invention, the SG and EG nanosheet/nanowire transistors fabrication processes diverge to a degree in the fabrication of the central SG channel nanosheet and the central region of the topmost EG sacrificial nanosheet. More specifically, the central SG channel nanosheet is formed over a portion of the central SG sacrificial nanosheet, and the central region of the topmost EG sacrificial nanosheet is formed over the lower region of the topmost EG sacrificial nanosheet. In embodiments of the invention, the central SG channel nanosheet and the central region of the topmost EG sacrificial nanosheet can be formed by forming the central SG channel nanosheet to extend over both central SG sacrificial nanosheet and the lower region of the topmost EG sacrificial nanosheet. The portion of the central SG channel nanosheet that is over the lower region of the topmost EG sacrificial nanosheet is replaced by the central region of the topmost EG sacrificial nanosheet.

Using the fabrication processes in accordance with aspects of the invention, the bottommost and topmost EG sacrificial nanosheets, which define the space that will be occupied by the EG gate oxide and the EG metal gate, will be provided with sufficient volume to accommodate the larger volume of gate metal and/or a thicker gate oxide that are required by EG nanosheet/nanowire transistors. Of the 6 layer deposition operations and resulting layers described in the above example, 5 of the layer deposition operations and resulting layers are used in the fabrication of both the SG and the EG nanosheet transistors, and only 1 of the layer deposition operations and resulting layers is different for the SG and the EG nanosheet transistors. Because the same layer of channel nanosheet materials is used to form the topmost SG channel nanosheet and the topmost EG channel nanosheet, the top surfaces of the topmost SG channel nanosheet and the topmost EG channel nanosheet are substantially co-planar, which reduces the likelihood that downstream wafer processing (e.g., recessing certain devices to the level of their topmost channel nanosheet) will not result in the recessed surface having a non-planar topology.

FIG. 1 depicts a cross-sectional view of a section 100 of a substrate/wafer 102A having a SG nanosheet transistor 140 and an EG nanosheet transistor 170 formed thereon. The active regions of the SG nanosheet transistor 140 includes stacked nanosheet channels 122A, 124B, 126A positioned between a source region 802 and a drain region 804. Multi-segmented gate metal regions 1404, multi-segmented high-k dielectric regions 1402, and optionally multi-segmented gate dielectric regions (not shown) are formed over and around the stacked nanosheet channels 122A, 124B, 126A in a GAA configuration. In the example shown in FIG. 1, the stacked nanosheet channels 122A, 124A, 126B are Si. The SG nanosheet transistor 140 also includes a portion of an interlayer dielectric (ILD) region 902, gate spacers 606, upper SG inner spacers 702, central SG inner spacers 704, and lower SG inner spacers 706, configured and arranged as shown.

The active regions of the EG nanosheet transistor 170 include a topmost and a bottommost EG nanosheet channels 126B, 122B positioned between a source region 806 and a drain region 808. Multi-segmented gate metal regions 1414, multi-segmented high-k dielectric regions 1412, and multi-segmented gate dielectric regions 704A are formed over and around the stacked nanosheet channels 122B, 126B in a GAA configuration. In the example shown in FIG. 1, the EG nanosheet channels 122B, 126B are Si. The EG nanosheet transistor 170 also includes a portion of the ILD region 902, gate spacers 616, upper EG inner spacers 712, and lower EG inner spacers 716, configured and arranged as shown. In embodiments of the invention, transistor isolation can be provided by forming shallow trench isolation (STI) regions (not shown) between the SG nanosheet transistor 140 and the EG nanosheet transistor 170. In embodiments of the invention, the STI regions can be formed by depositing bulk dielectric material between the SG nanosheet transistor 140 and the EG nanosheet transistor 170 and recessing the bulk dielectric to the desired level.

As shown in FIG. 1, the EG nanosheet transistor 170 provides additional room for a larger EG metal gate 1414 and a thicker EG gate dielectric oxide 704A by providing a larger space (i.e., a space larger than is typically provided/required in SG nanosheet transistors) between the EG channel nanosheet 122B and the substrate 102, and by providing two EG nanosheet channels 122B, 126B instead of the three nanosheet channels 122A, 124B, 126A formed for the SG nanosheet transistors 140. The space that would have been occupied by a third (and centrally located) EG nanosheet channel allows for the creation of a larger space between the two EG nanosheet channels 122B, 126B that accommodates the larger EG metal gate 1414 and the thicker EG gate dielectric oxide 704A. In embodiments of the invention, the larger space between the EG channel nanosheet 122B and the substrate 102 is substantially the same as the space between the SG channel nanosheet 122A and the substrate 102. However, because the space between the SG channel nanosheet 122A and the substrate 102 is part of the SG nanosheet transistors 140, the space between the SG channel nanosheet 122A and the substrate 102 is occupied by the SG gate dielectric/oxide (not shown) (which is thinner than the EG gate dielectric/oxide 704A), the high-k dielectric 1402 and the SG metal gage 1404. As described in greater detail in connection with the fabrication operations depicted in FIGS. 2-13, because the larger space between the EG channel nanosheet 122B and the substrate 102 is substantially the same as the space between the SG channel nanosheet 122A and the substrate 102, the same fabrication operations can be used to fabricate the device components that define this space.

In embodiments of the invention, the topmost SG channel nanosheet 126A is formed from the same channel nanosheet layer 126 (shown in FIG. 5) as the topmost EG channel nanosheet 126B. Accordingly, a top surface of the topmost SG channel nanosheet 126A is substantially co-planar with respect to the topmost EG channel nanosheet 126B. Because the top surfaces of the topmost SG channel nanosheet 126A and the topmost EG channel nanosheet 126B are substantially co-planar, the likelihood that downstream wafer processing (e.g., recessing certain devices to the level of their topmost channel nanosheet) will result in the recessed surface having a non-planar topology is reduced. Because the topmost SG channel nanosheet 126A is formed from the same channel nanosheet layer 126 (shown in FIG. 5) as the topmost EG channel nanosheet 126B, substantially the same fabrication operations that are used to form the topmost SG channel nanosheet 126A are used to form the topmost EG channel nanosheet 126B.

Figure 2:
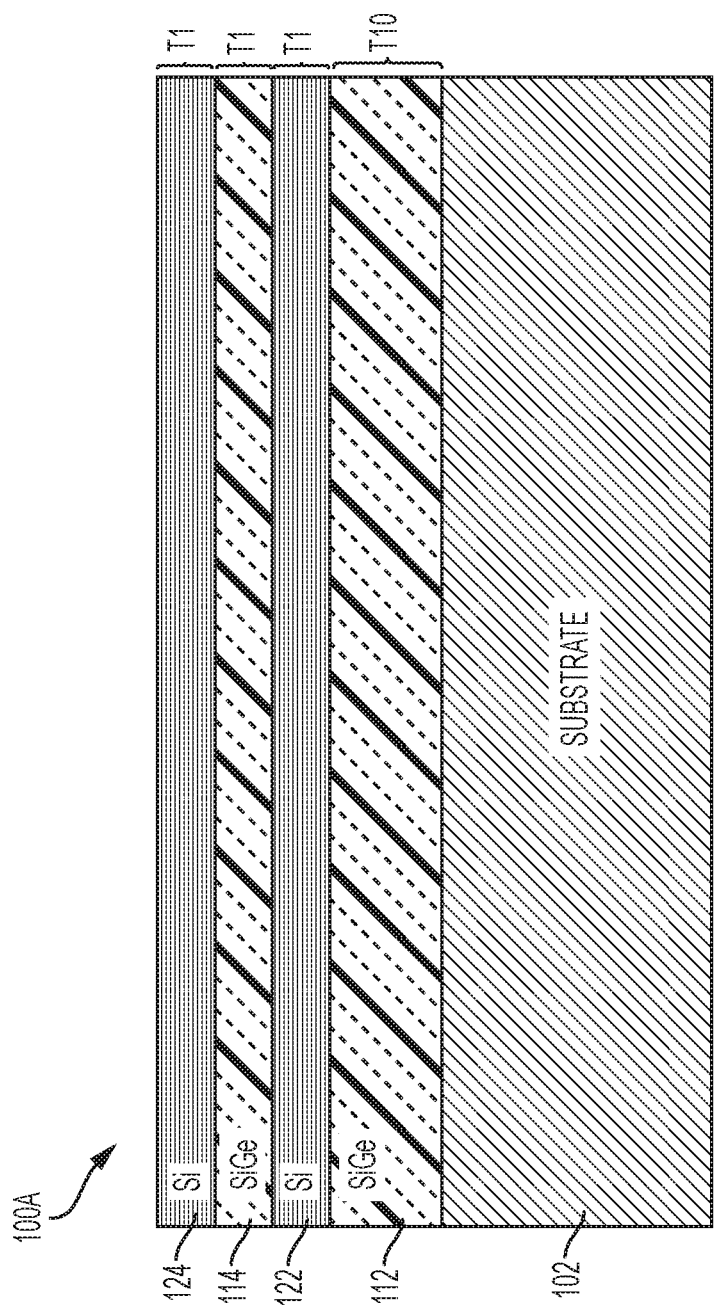

FIGS. 2-13 depict cross-sectional views of section 100A of the substrate/wafer 102 after various fabrication operations to form the SG nanosheet transistor device 140 and the EG nanosheet transistor device 170 on the same substrate 102 in accordance with embodiments of the invention. As shown in FIG. 2, after initial stages of the described fabrication processes, the space in which the SG device 140 and the EG device 170 will be formed are the same. As shown in FIG. 2, an alternating series of SiGe sacrificial nanosheet layers 112, 114 and Si nanosheet layers 122, 124 are formed in a stack on the substrate 102. In some embodiments of the invention, the SiGe nanosheet layers 112, 114 can be SiGe 25%. The notation "SiGe 25%" is used to indicate that 25% of the SiGe material is Ge.

In embodiments of the invention, the alternating nanosheet layers depicted in FIG. 2 can be formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In FIG. 2, the relative thickness dimensions of the alternating layers are shown as T10 and T1. For reasons that will be describe later, T10 is selected to reserve sufficient space for the formation of the larger EG metal gate 1414 (shown in FIG. 1) and the thicker EG gate dielectric oxide 704A (shown in FIG. 1). T1 is selected to accommodate the performance requirements of both the SG nanosheet transistor 140 (shown in FIG. 1) and the EG nanosheet transistor 170 (shown in FIG. 1). In embodiment of the invention, T1 can be the same for the layers 122, 114, 124. In embodiments of the invention, T1 can be different for the layers 122, 114, 124. In embodiments of the invention, T10 is greater than T1.

Figure 3:
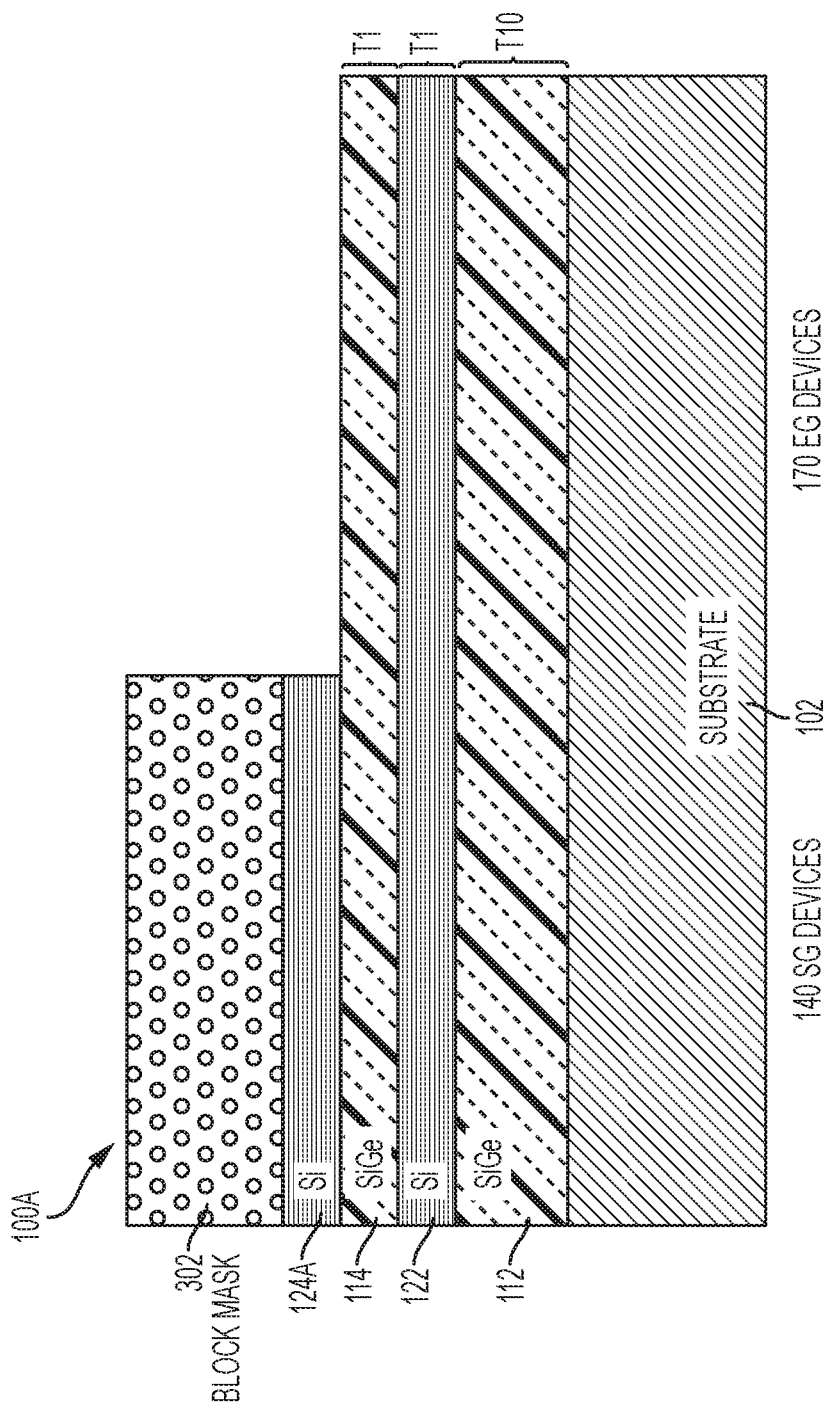

In FIG. 3, a block mask 302 is placed over the region of the substrate 102 over which SG nanosheet transistor devices 140 will be formed, leaving exposed the region of the substrate 102 over which the EG nanosheet transistor devices 170 will be formed. Known semiconductor fabrication techniques have been used to remove the portion of the Si layer 124 (shown in FIG. 2) that is not under the block mask 302, thereby forming the Si layer 124A.

Figure 4:
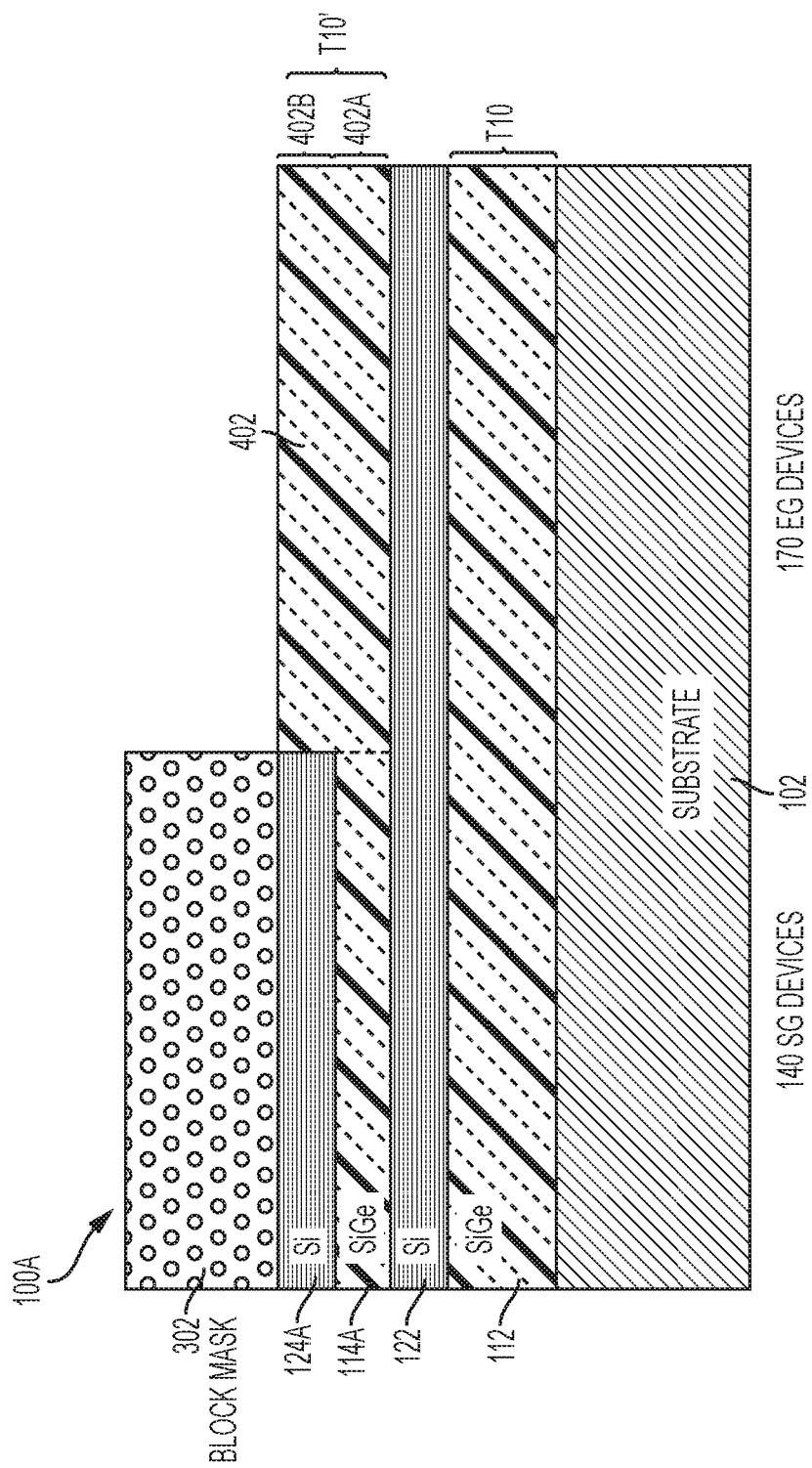

In FIG. 4, known semiconductor fabrication techniques have been used to form a SiGe layer 402 having a first region 402A, a second region 402B, and a thickness dimension T10'. The first region 402A is the portion of the SiGe layer 114 (shown in FIG. 3) that is not under the block mask 302. In embodiments of the invention, the second region 402B can be epitaxially grown from the first region 402A.

Figure 5:
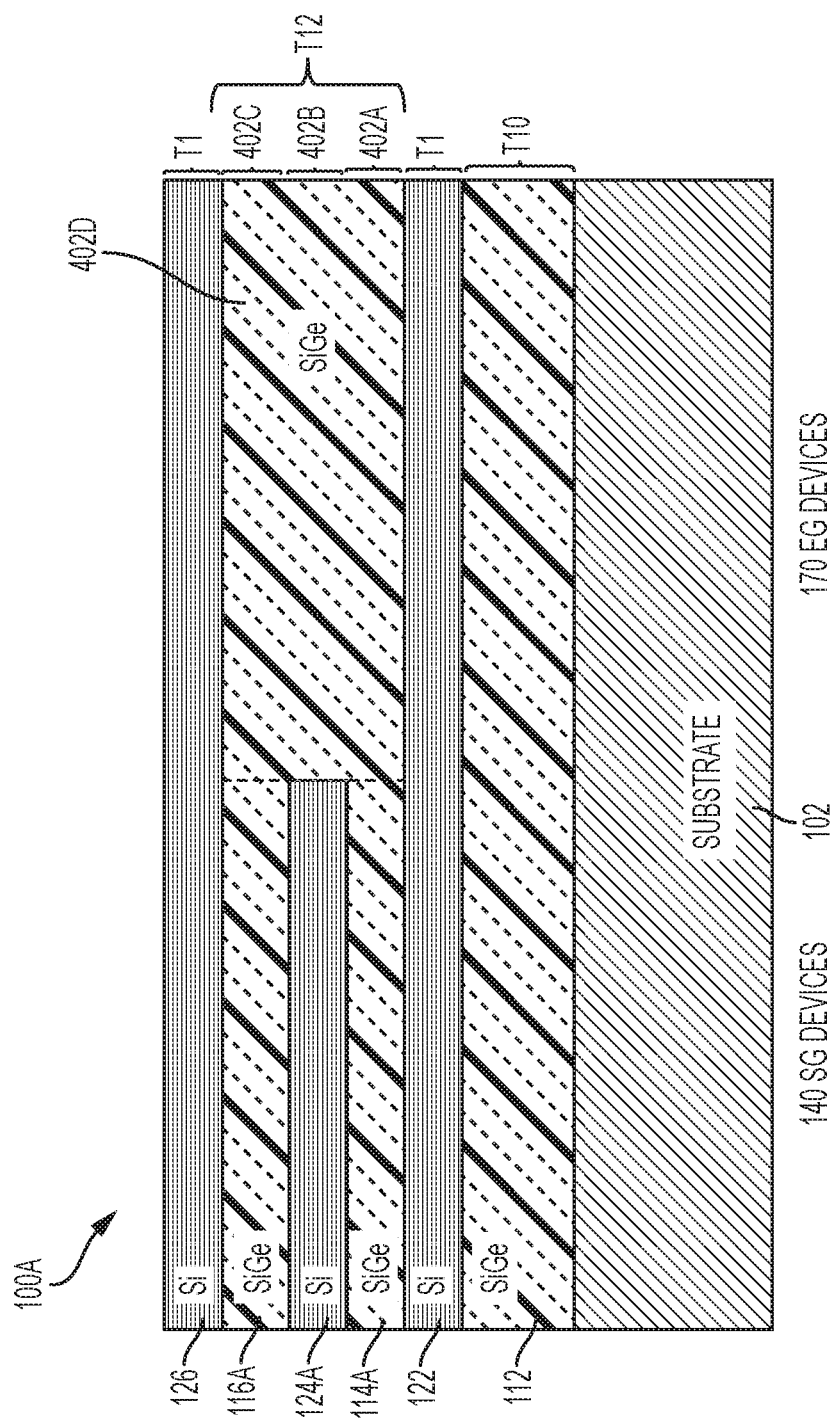

In FIG. 5, the block mask 302 has been removed, and known semiconductor fabrication techniques have been used to deposit a SiGe layer over the Si layer 124A and the second region 402B. The SiGe layer deposited over the Si layer 124A and the second region 402B forms the SiGe layer 116A and third region 402C of a relatively thick (T12) SiGe region 402D. In embodiments of the invention, the SiGe layer deposited over the Si layer 124A and the second region 402B can be deposited using epitaxial growth techniques. Known semiconductor fabrication techniques are used to form a Si layer 126 to the thickness dimension T1 over the SiGe layer 116A and the third region 402C of the relatively thick SiGe region 402D. In embodiments of the invention, the Si layer 126 is formed over the SiGe layer 116A and the third region 402C of the relatively thick SiGe region 402D using epitaxial growth techniques. In embodiment of the invention, T1 can be the same for the layers 122, 114A, 124A, 116A, 126, 402A, 402B, 402C. In embodiments of the invention, T1 can be different for the layers 122, 114A, 124A, 116A, 126, 402A, 402B, 402C. In embodiments of the invention, T12 is greater than T1. In embodiments of the invention, T12 is greater than T10.

Figure 6A:
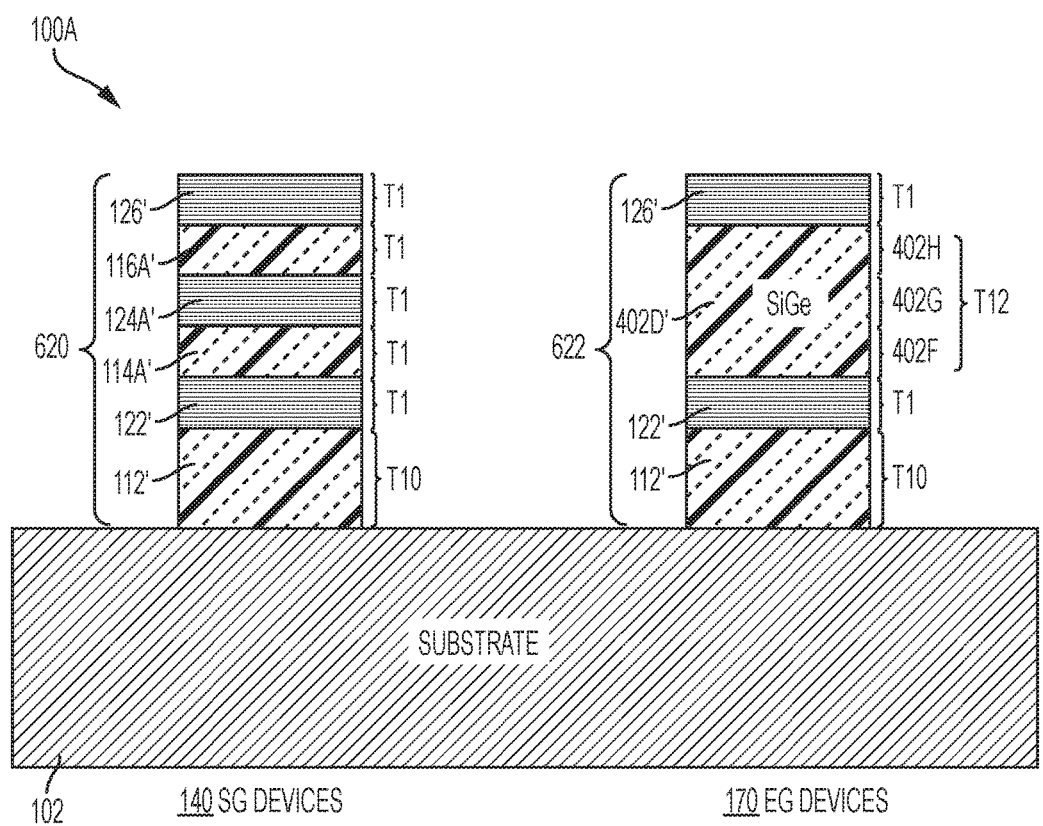
FIG. 6A depicts a cross-sectional view of semiconductor structures after fabrication operations for forming SG nanosheet transistor devices and EG nanosheet transistor devices on the same substrate according to embodiments of the invention.
Figure 6B:
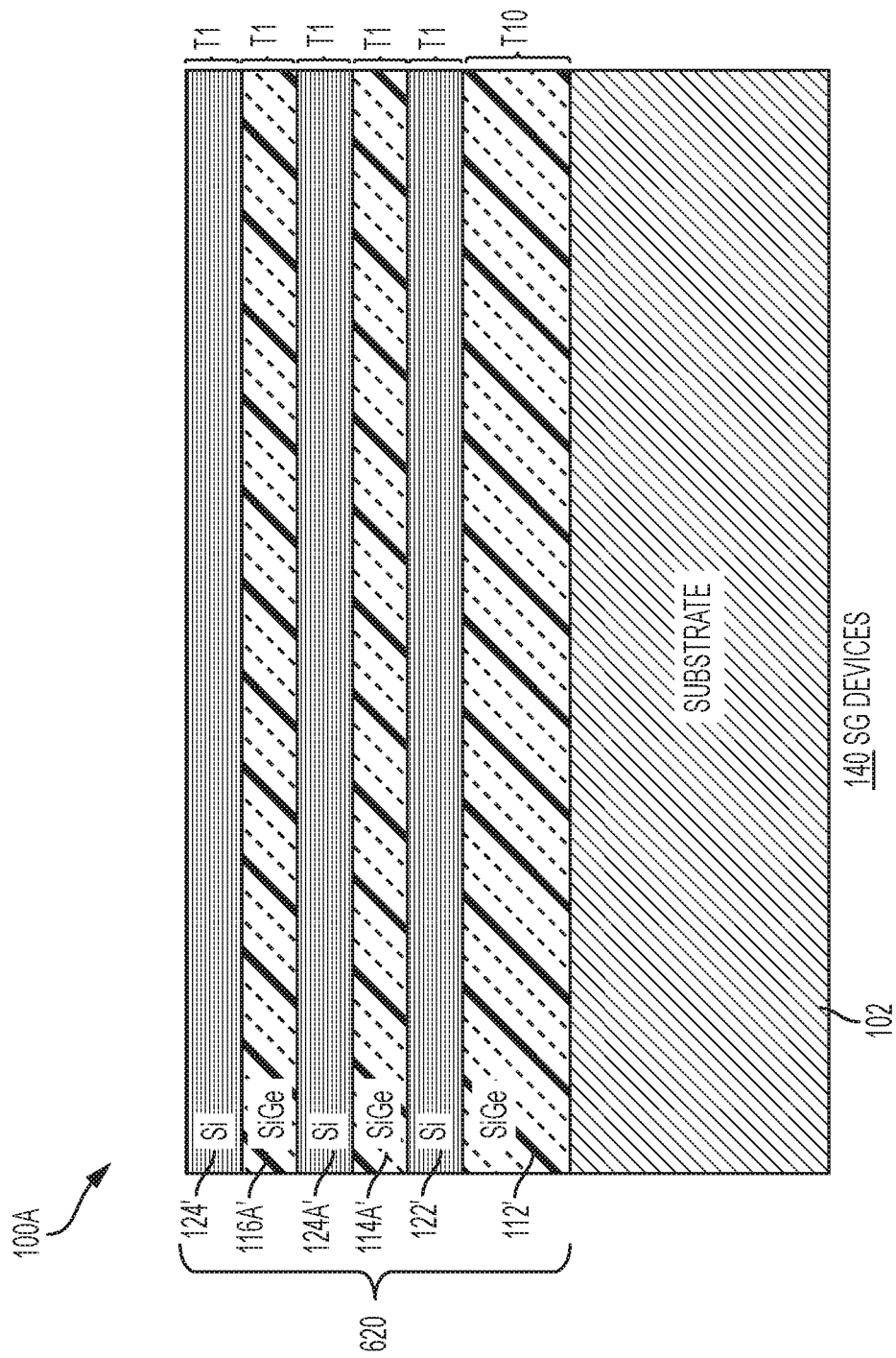
FIG. 6B depicts a cross-sectional view of the semiconductor structures shown in FIG. 6A rotated counterclockwise by 90 degrees.

FIGS. 6A-6C depict cross-sectional views of section 100A of the substrate/wafer 102 after fabrication operations for forming SG nanosheet transistor devices 140 (shown in FIG. 1) and EG nanosheet transistor devices 170 (shown in FIG. 1) on the same substrate 102 according to embodiments of the invention. More specifically, FIG. 6B depicts a cross-sectional view of the semiconductor structures shown in FIG. 6A rotated counterclockwise by 90 degrees, and FIG. 6C depicts a cross-sectional view of the semiconductor structures shown in FIG. 6A rotated clockwise by 90 degrees.

In FIG. 6A, known semiconductor fabrication operations have been used to etch or recess the alternating nanosheet layers 112, 122, 114A, 124A, 116A, 126, 402D shown in FIG. 5 to form multiple intermediate elongated columns 620, 622. In an example fabrication process, a patterned hard mask (not shown) is deposited over the alternating nanosheet layers 112, 122, 114A, 124A, 116A, 126, 402D. The pattern of the hard mask defines the footprints of the multiple intermediate elongated columns 620, 622. FIG. 6A is a view of the intermediate elongated columns 620, 622 by a person standing in front the narrowest sidewalls of the intermediate elongated columns 620, 622 (i.e., in the cross-fin direction). FIG. 6B is a view of one of the intermediate elongated columns 620 by a person standing in front of the elongated sidewall of one of the intermediate elongated columns 620 (i.e., in the along-fin direction). FIG. 6C is a view of one of the intermediate elongated columns 622 by a person standing in front of the elongated sidewall of one of the intermediate elongated columns 622 (i.e., in the along-fin direction). An etch (e.g., an RIE) or a recess is applied to remove the portions of the alternating nanosheet layers that are not covered by the patterned hard mask, thereby forming the intermediate elongated columns 620, 622.

After the fabrication operations depicted in FIGS. 6A, 6B, and 6C, the elongated columns 620 include alternating layers 112', 122', 114A', 124A', 116A', 126', and the elongated columns 622 include alternating layers 112', 122', 402D', 126'. In FIG. 6B, although only one of the intermediate elongated fin-shaped columns 620 is shown in the two-dimensional (X-axis and Y-axis) cross-sectional diagram shown in FIG. 6B, multiple additional intermediate elongated fin-shaped columns (specifically, the elongated columns 622) are positioned behind the intermediate elongated fin-shaped column 620 and extend into the page in the Y-axis direction. The additional intermediate elongated fin-shaped columns positioned behind the intermediate elongated fin-shaped column 620 are substantially the same as the intermediate elongated fin-shaped column 622 (shown in FIGS. 6A and 6C). In FIG. 6C, although only one of the intermediate elongated fin-shaped columns 622 is shown in the two-dimensional (X-axis and Y-axis) cross-sectional diagram shown in FIG. 6C, multiple additional intermediate elongated fin-shaped columns (specifically, the elongated columns 620) are positioned behind the intermediate elongated fin-shaped column 622 and extend into the page in the Y-axis direction. The additional intermediate elongated fin-shaped columns positioned behind the intermediate elongated fin-shaped column 622 are substantially the same as the intermediate elongated fin-shaped column 620 (shown in FIGS. 6A and 6B).

Figure 7:
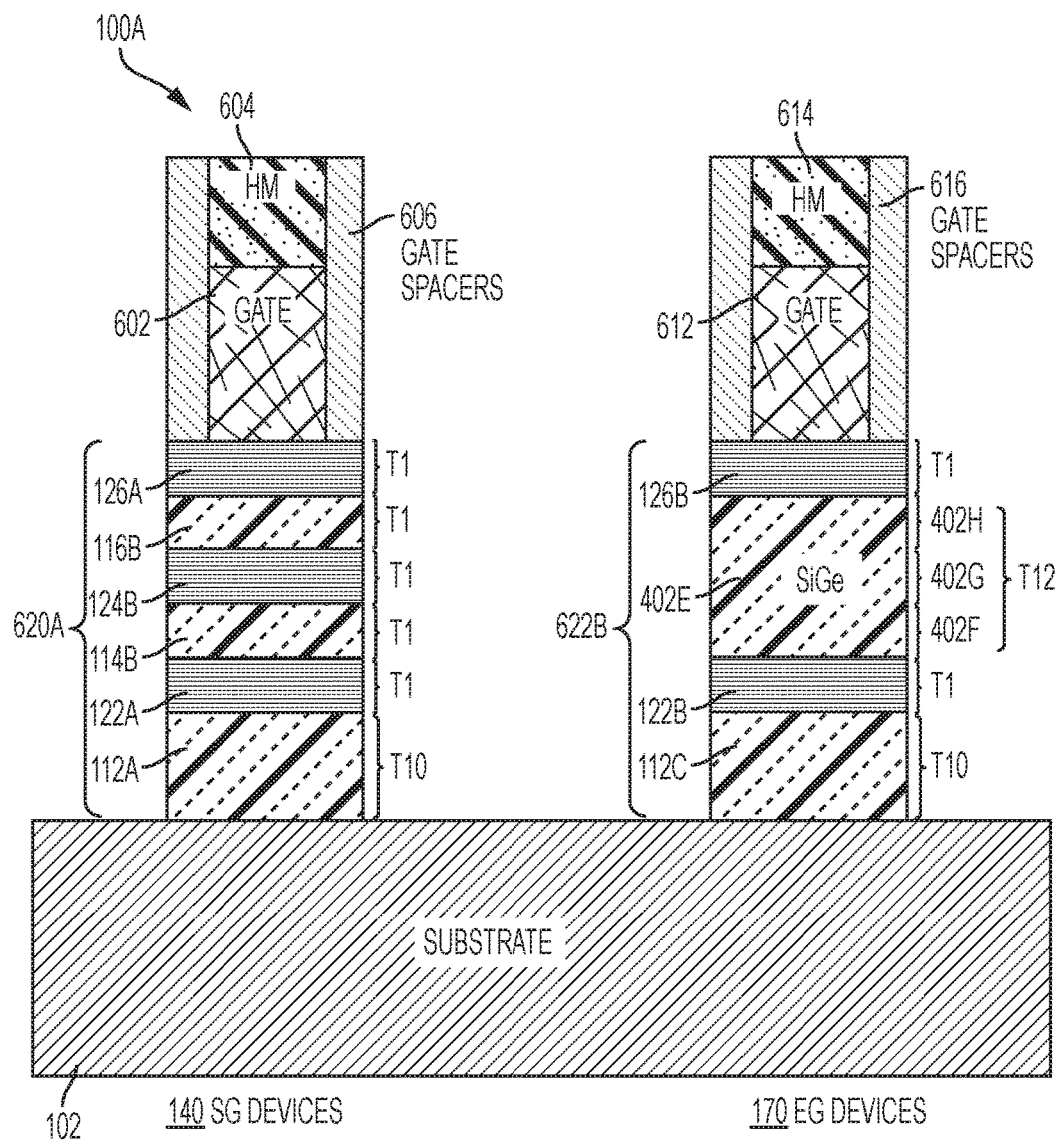

In FIG. 7, known semiconductor fabrication operations have been used to form dummy gates 602, 612 and hard masks 604, 614 that extend over and around each of the intermediate elongated columns 620, 622 (shown in FIGS. 6A, 6B, and 6C). Although the dummy gates 602, 612 are depicted in cross-sectional, two-dimensional views in FIG. 7, in practice, the dummy gates 602, 612 have been formed over and around the sidewalls of each of the intermediate elongated fin-shaped columns 620, 622 (shown in FIGS. 6A, 6B and 6C). The dummy gates 602, 612 can be formed by depositing amorphous silicon (a-Si) over and around the intermediate elongated columns 620, 622. The a-Si is then planarized to a desired level. A hard mask layer (not shown) is deposited over the planarized a-Si and patterned to form the hard masks 604, 614. In embodiments of the invention, the hard masks 604, 614 can be formed from a nitride or an oxide layer. An etching process (e.g., an RIE) is applied to the a-Si to form the dummy gates 602, 612.

In FIG. 7, known semiconductor fabrication operations have been used to form offset gate spacers 606, 616, which will be used in subsequent fabrication operations to form fin-shaped columns 620A, 622B from the intermediate elongated fin-shaped columns 620, 622 (shown in FIGS. 6A, 6B, 6C). The offset gate spacers 606, 616 are formed along sidewalls of the dummy gates 602, 612, and then an etch or a recess is applied to the intermediate elongated columns 620, 622 (shown in FIGS. 6A, 6B, 6C) to form a first set of the final fin-shaped columns 620A and a second set of the final fin-shaped columns 622B by etching or recessing the portions of the intermediate elongated fin-shaped columns 620, 622 that are not covered by the dummy gates 602, 612 and the offset spacers 606, 616. The offset spacers 606, 616 can be formed using a spacer pull down formation process. The offset spacers 606, 616 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

In FIG. 7, subsequent to formation of the offset gate spacer 606, 616, known semiconductor fabrication operations have been used to form fin-shaped columns 620A, 622A from the intermediate elongated fin-shaped columns 620, 622 (shown in FIGS. 6A, 6B, 6C). In the formation of the fin-shaped columns 620A, 622A, the offset gate spacers 606, 616, the gates 602, 612, and the hard masks 604, 614 can be used as a mask to define the footprint of the fin-shaped columns 620A, 622A, and a recess or etch can be applied to the elongated fin-shaped columns 620, 622 to form the fin-shaped columns 620, 622. The fin-shaped columns 620A, 622A are positioned in a region of the substrate 102 where the SG nanosheet transistors 140 (shown in FIG. 1) will be formed, and the fin-shaped columns 622A are positioned in a region of the substrate 102 where the EG nanosheet transistors 170 (shown in FIG. 1) will be formed. Each of the fin-shaped columns 620A includes a stack of alternating SiGe/Si nanosheet regions 112A, 122A, 114B, 124B, 116B, 126A. Similarly, each of the fin-shaped columns 622A includes a stack of alternating SiGe/Si nanosheet regions 112C, 122B, 402E, 126B.

Figure 8:
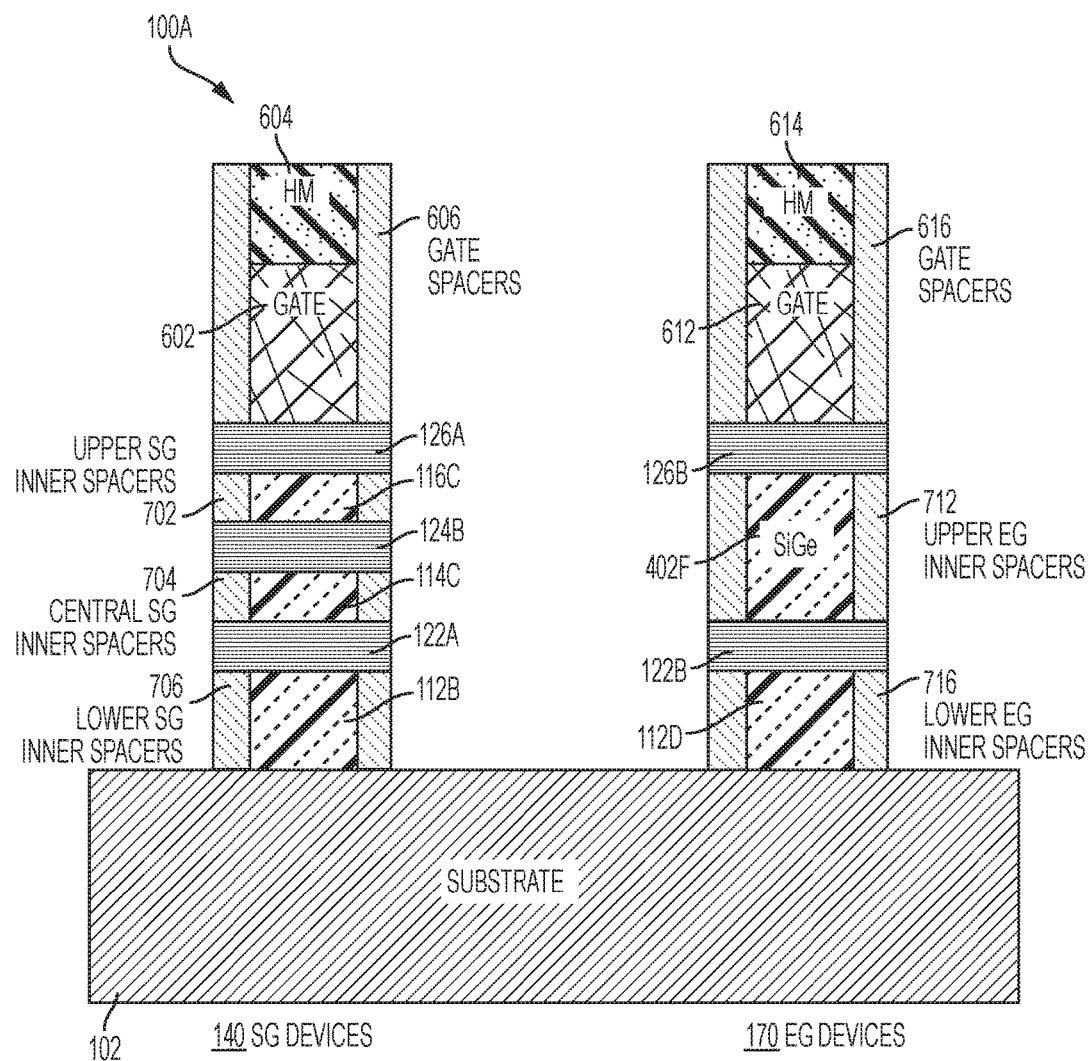

In FIG. 8, known semiconductor fabrication processes have been used to partially remove end regions of the SiGe sacrificial nanosheet regions 112A, 114B, 116B, 112C, 402E (shown in FIG. 7), thereby forming etched intermediate SiGe sacrificial nanosheet regions 112B, 114C, 116C, 112D, 402F. In embodiments of the invention, the end regions of the SiGe nanosheet regions 112A, 114B, 116B, 112C, 402E can be removed using a first application of a so-called "pull-back" process to pull the SiGe nanosheet regions 112A, 114B, 116B, 112C, 402E back an initial pull-back distance such that the end regions terminate underneath the offset gate spacers 606, 616. In embodiments of the invention, the pull-back process includes a hydrogen chloride (HCL) gas isotropic etch process, which etches SiGe without attacking Si.

As also shown in FIG. 8, known semiconductor device fabrication processes have been used to form upper SG inner spacers 702, central SG inner spacers 704, lower SG inner spacers 706, upper EG inner spacers 712, and lower EG inner spacer 716. In embodiments of the invention, the upper SG inner spacers 702, central SG inner spacers 704, lower SG inner spacers 706, upper EG inner spacers 712, and lower EG inner spacer 716 can be formed conformally by CVD, or by monolayer doping (MLD) of nitride followed by spacer RIE. The upper SG inner spacers 702, central SG inner spacers 704, lower SG inner spacers 706, upper EG inner spacers 712, and lower EG inner spacer 716 can be deposited using, e.g., a conformal deposition process and subsequent isotropic or anisotropic etch back to remove excess spacer material on vertical sidewalls of the nanosheet stack structure 620A, 622A (shown in FIG. 7) and on the surface of the semiconductor substrate 102. The inner spacer material can be formed from the same or different material as the spacer layers 606 and 616 of the dummy gate stack 602, 604, 612, 614 (e.g., silicon nitride). For example, the inner spacer material can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of FET devices.

Figure 9:
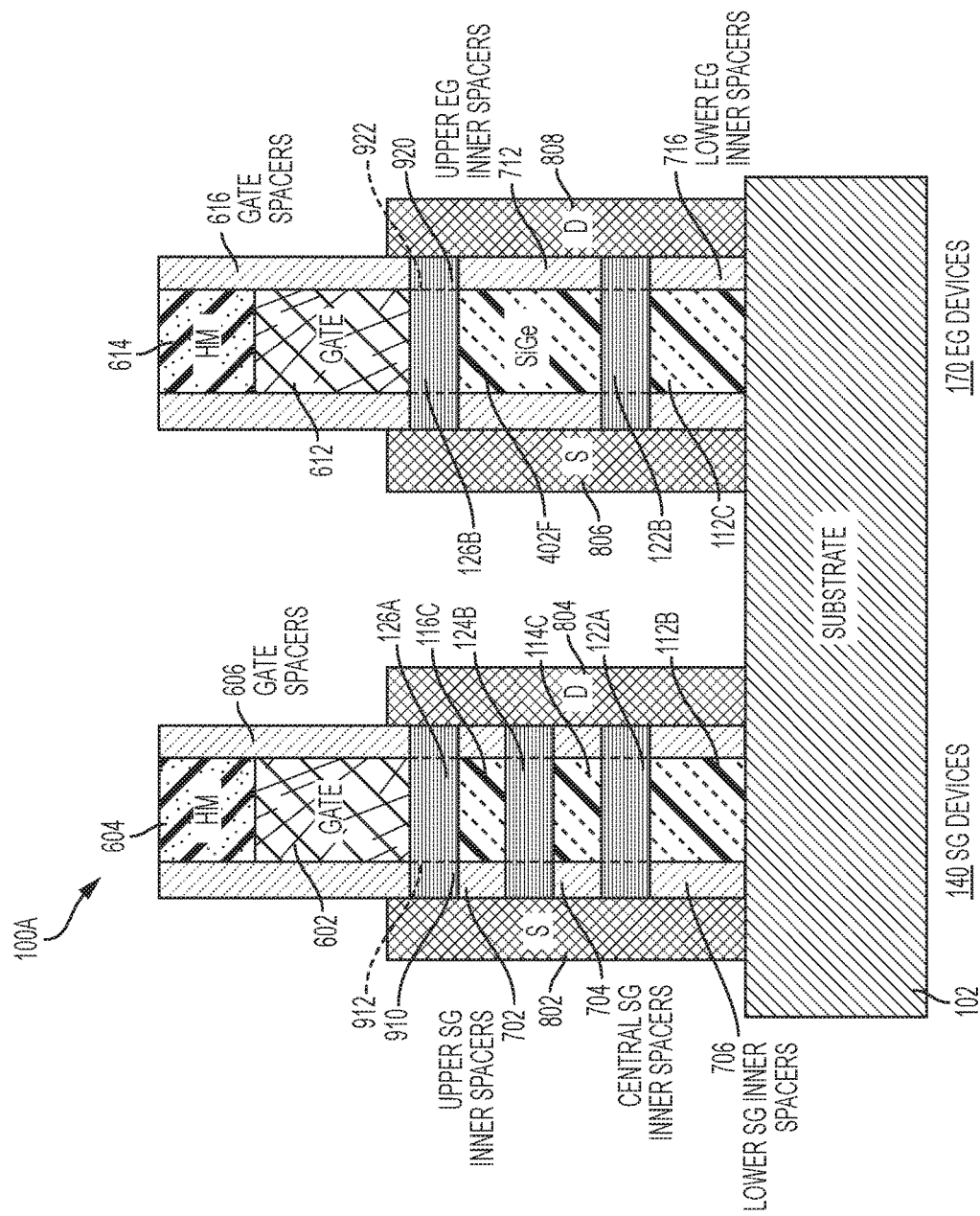

In FIG. 9, known semiconductor device fabrication processes have been used to form raised source/drain (S/D) regions 802, 804, 806, 808. In embodiments of the invention, the raised S/D regions 802, 804 are formed using an epitaxial layer growth process on the exposed ends of the Si channel nanosheet regions 122A, 124B, 126A in the region of the substrate 102 where the SG nano sheet transistor 140 will be formed. In embodiments of the invention, the raised S/D regions 806, 808 are formed using an epitaxial layer growth process on the exposed ends of the Si channel nanosheet regions 122B, 126B in the region of the substrate 102 where the EG nanosheet transistor 170 will be formed. In-situ doping (ISD) is applied to form doped S/D regions 802, 804, 806, 808, thereby creating the necessary junctions for the SG nanosheet transistor 140 and the EG nanosheet transistor 170. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In embodiments of the invention, the epitaxial growth and in-situ doping used to form the raised S/D regions 802, 804, 806, 808 are controlled in a manner that forms extension regions 910, 920 having extension junctions 912, 922 within the Si channel nanosheets 122A, 124B, 126A, 122B, 126B. For ease of illustration, only selected ones of the extension regions 910, 920 and extension junctions 912, 922 are provided with reference numbers. Extension regions 910, 920 and extension junctions 912, 922 extend under offset gate spacers 606, 616, and the regions of the Si channel nanosheets 122A, 124B, 126A, 122B, 126B under the gate dummy gates 602, 612 remain undoped. In embodiments of the invention, the doping of extension regions 910, 920 can be performed by implanting the end regions of the Si channel nanosheet regions 122A, 124B, 126A, 122B, 126B with ions (or dopants). Extension junctions 912, 922 reduce the $R_{ext}$ of the SG nanosheet transistors 140 and/or the EG nanosheet transistors 170 when they are turned on by applying the appropriate gate bias voltages. The extension junctions 912, 922 also form a conducting path between S/D regions 802, 804, 806, 808 and the Si channel nanosheet regions 122A, 124B, 126A, 122B, 126B. In order to optimize transistor performance, the extension junctions 912, 922 can be positioned such that they terminate in substantially the same plane that the final SG metal gate structure 1404 (shown in FIG. 1) and the final EG metal gate structure 1414 (shown in FIG. 1) begin. In embodiments of the invention, substantially the same epitaxial growth and in-situ doping processes can be used to form the S/D regions, the extension regions 910, 920 and the extension junctions 912, 922 in the SG nanosheet transistors 140 and the EG nanosheet transistors 170, which allows the extension regions 910, 920 and the extension junctions 912, 922 to be formed to a substantially uniform extension region thickness and substantially the same relative extension junction locations (e.g., with respect to the terminating end of the metal gate) in the SG nano sheet transistors 140 and the EG nanosheet transistors 170.

Figure 10:
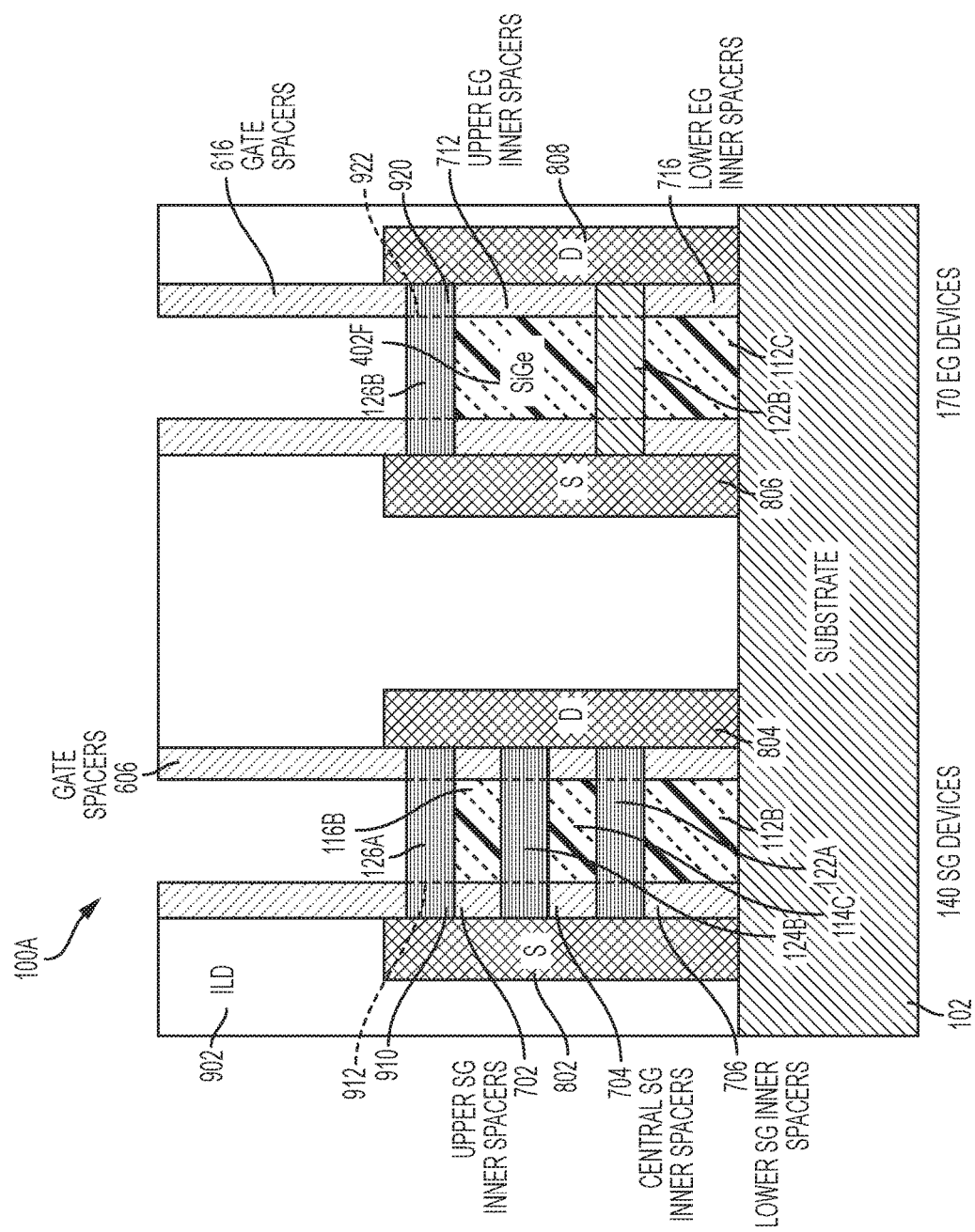

In FIG. 10, known semiconductor fabrication operations have been used to form a protective interlayer dielectric (ILD) region 902. The ILD region 902 can be formed by depositing an oxide material in bulk (e.g., silicon dioxide) and polishing the bulk oxide back (e.g., using CMP) to the level of the offset gate spacers 606, 610 (shown in FIG. 9) and the hard masks 604, 614. Subsequent to forming the protective ILD region 902, the dummy gates 602, 612 and the hard masks 604, 614 are removed. The dummy gates 602, 612 and the hard mask 604, 614 can be removed by a known etching process, e.g., RIE or chemical oxide removal (COR).

Figure 11:
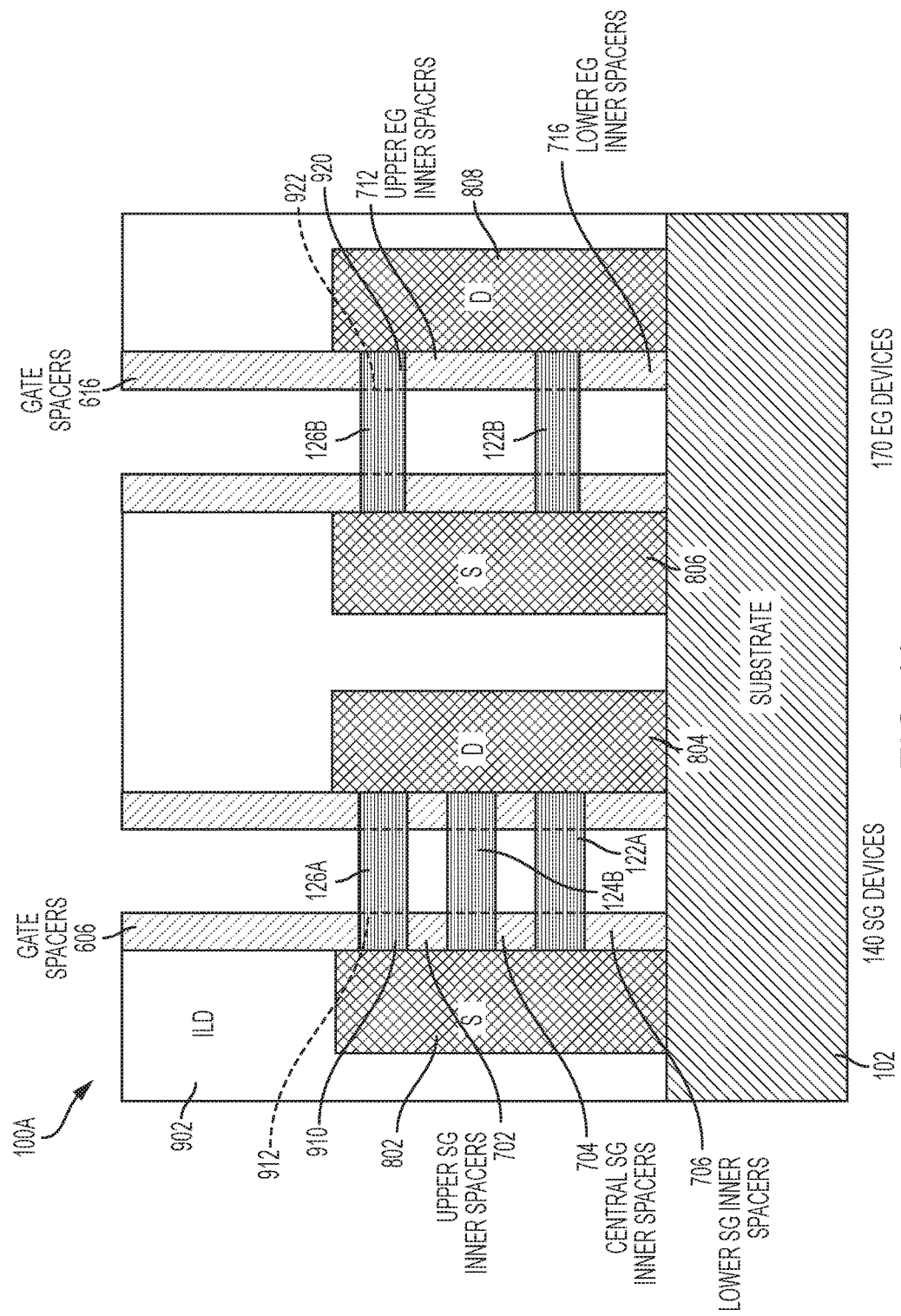

In FIG. 11, known semiconductor fabrication operations have been used to remove the SiGe sacrificial nanosheets 112B, 114C, 116B, 112C, 402F (shown in FIG. 10). In embodiments of the invention, the SiGe sacrificial nanosheet regions 112B, 114C, 116B, 112C, 402F can be removed by applying a selective etch (e.g., a hydrochloric acid (HCl)).

Figure 12:
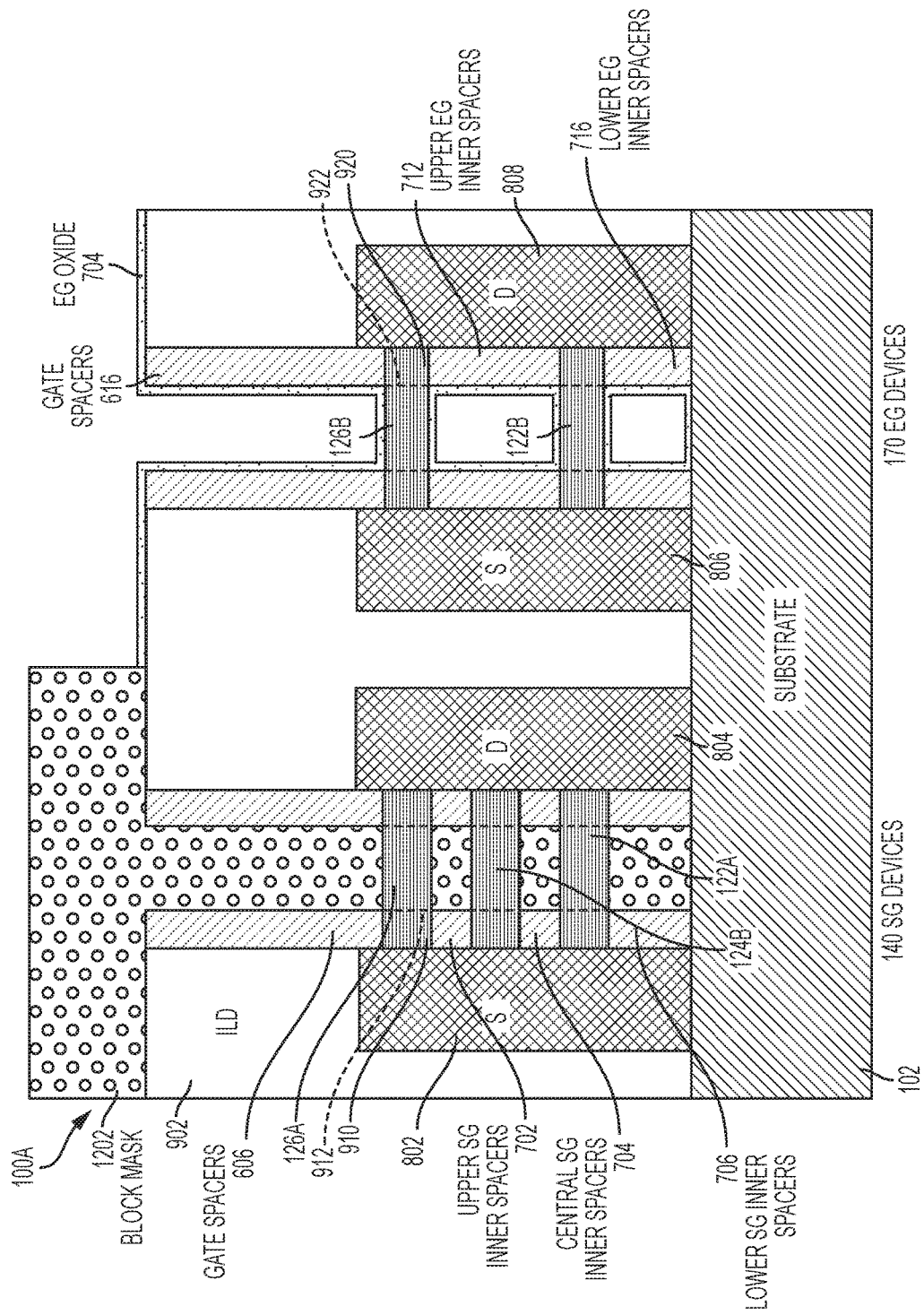

In FIG. 12, a block mask 1202 has been applied to cover the portion of the substrate 102 over which the SG nanosheet transistor device 140 will be formed, and a relatively thick (e.g., from about 1 nm to about 10 nm) EG dielectric (e.g., silicon oxide) layer 704 is deposited in spaces that were occupied by the removed dummy gates 612 (shown in FIG. 9), hard masks 614 (shown in FIG. 9), and SiGe sacrificial nanosheets 112C, 402F (shown in FIG. 10). In embodiments of the invention, the relatively thick EG dielectric/oxide 704 can be deposited using any suitable method, including, for example, atomic layer deposition (ALD).

Figure 13:
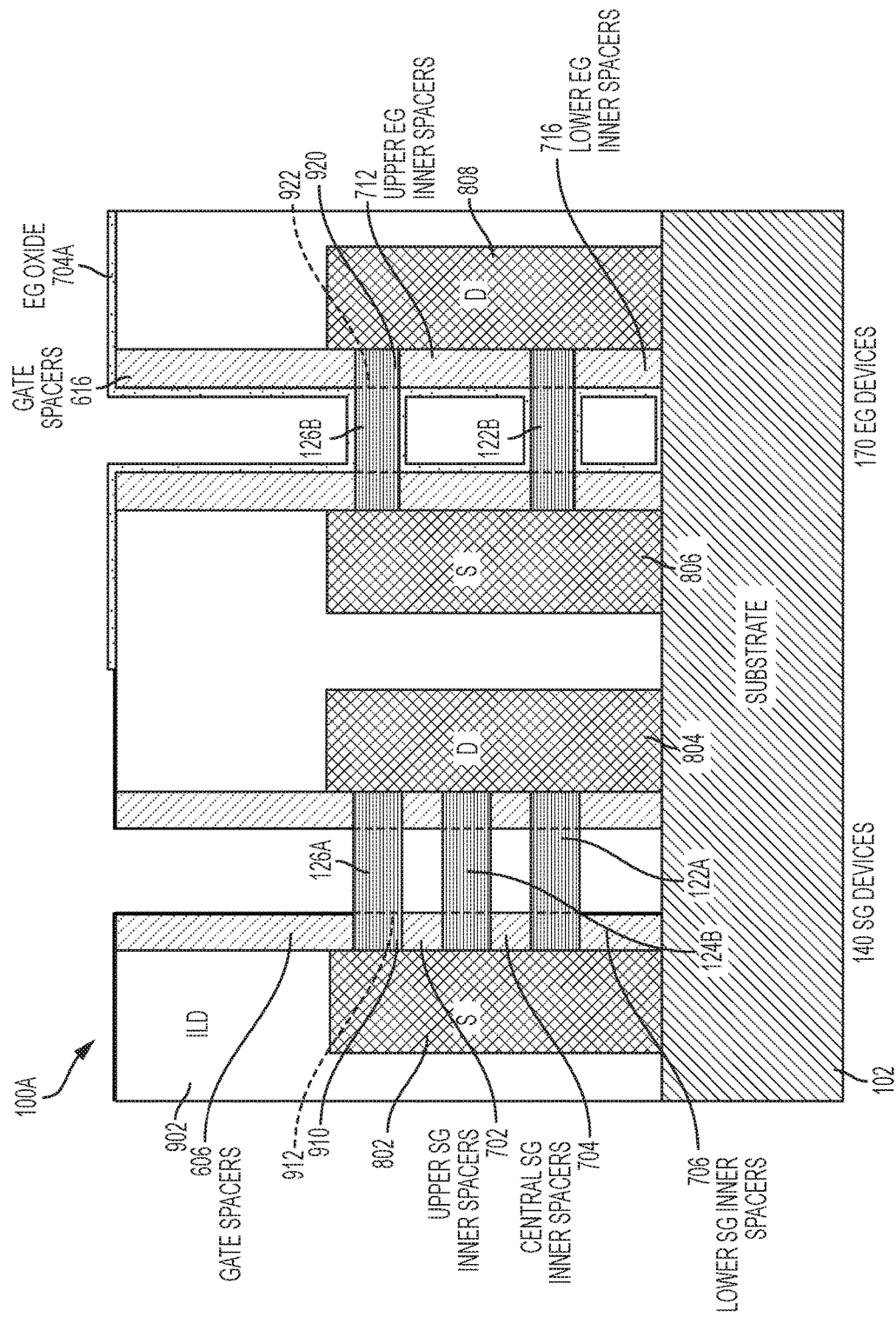

In FIG. 13, the block mask 1202 has been removed, and a relatively thin (e.g., from about 0.5 nm to about 1 nm) SG dielectric (e.g., silicon oxide) layer (not shown) is optionally deposited over the relatively thick EG dielectric layer 704 (shown in FIG. 12) and in spaces that were occupied by the removed dummy gates 602 (shown in FIG. 9), hard masks 604 (shown in FIG. 9), and SiGe sacrificial nanosheets 112B, 114C, 116B (shown in FIG. 10). Depositing the relatively thin SG dielectric layer over the relatively thick EG dielectric layer 704 results in the slightly thicker EG dielectric layer 704A. In embodiments of the invention, the relatively thin SG dielectric/oxide can be deposited using any suitable method, including, for example, atomic layer deposition (ALD).

The results of fabrication operations subsequent to the fabrication operations shown in FIG. 13 are shown in FIG. 1, wherein known semiconductor fabrication processes (e.g., a gate-late fabrication process) have been used to form high-k dielectric layers 1402, 1412 and multi-segmented SG metal gate structures 1404, 1414 in the open spaces shown in FIG. 13. In embodiments of the invention, the gate metal structures 1404, 1414 can include a metal liner shown, e.g., a work-function metal (WFM) (now shown). In embodiments of the invention, the WFM can be, for example, TiN or TaN, and the metal gate 1404 can be aluminum or tungsten.

The multi-segmented metal gate structures 1404, the high-k dielectric 1402, and the optional relatively thin gate dielectric layer (not shown) surround the stacked Si nanosheet channel regions 122A, 124B, 126A and regulate electron flow through the Si nanosheet channel regions 122A, 124B, 126A between the source 802 and the drain 804. In order to optimize transistor performance, the extension junctions 912 can be positioned such that they terminate in the same plane that the final SG metal gate structure 1404 begins.

The multi-segmented metal gate structures 1414, the high-k dielectric 1412, and the relatively thick gate dielectric layer 704 surround the stacked Si nanosheet channel regions 122B, 126B and regulate electron flow through the Si nanosheet channel regions 122B, 126B between the source 806 and the drain 808. In order to optimize transistor performance, the extension junctions 922 can be positioned such that they terminate in the same plane that the final EG metal gate structure 1414 begins.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating semiconductor devices, the method comprising:
performing fabrication operations to form nanosheet field effect transistor devices on a substrate, wherein the fabrication operations include:
forming a first nanosheet transistor device and a second nanosheet transistor device on a substrate;
wherein forming the first nanosheet transistor comprises:
forming a first sacrificial nanosheet over a first region of a substrate, the first sacrificial nanosheet having a first sacrificial nanosheet thickness dimension;
forming a first channel nanosheet over the first sacrificial nanosheet and above the first region of the substrate, the first channel nano sheet having a first channel nanosheet thickness dimension;
forming a second sacrificial nanosheet over a first region of the first channel nanosheet and above the first region of the substrate, the second sacrificial nanosheet having a second sacrificial nanosheet thickness dimension;
forming a second channel nanosheet over a first region of the second sacrificial nanosheet and above the first region of the substrate, the second channel nanosheet having a second channel nanosheet thickness dimension;

forming a third sacrificial nanosheet over a first region of the second channel nanosheet and above the first region of the substrate, the third sacrificial nanosheet having a third sacrificial nanosheet thickness dimension; and forming a third channel nanosheet over a first region of the third sacrificial nanosheet and above the first region of the substrate, the third channel nanosheet having a third channel nanosheet thickness dimension;

wherein forming the second nanosheet transistor comprises:

forming the first sacrificial nanosheet over a second region of the substrate, the first sacrificial nanosheet having the first sacrificial nanosheet thickness dimension;

forming the first channel nanosheet over the first sacrificial nanosheet and above the second region of the substrate, the first channel nanosheet having the first channel nanosheet thickness dimension;

forming a fourth sacrificial nanosheet over a second region of the first channel nanosheet and above the second region of the substrate, the fourth sacrificial nanosheet having a second sacrificial nanosheet thickness dimension; and forming the third channel nanosheet over the fourth sacrificial nanosheet and above the second region of the substrate, the second channel nanosheet having a second channel nanosheet thickness dimension.

2. The method of claim 1, wherein the fourth sacrificial nanosheet thickness dimension is greater than the second sacrificial nanosheet thickness dimension.

3. The method of claim 1, wherein the fourth sacrificial nanosheet thickness dimension is greater than the third sacrificial nanosheet thickness dimension.

4. The method of claim 1, wherein the fourth sacrificial nanosheet thickness dimension is greater than a combined thickness of:
the second sacrificial nanosheet thickness dimension; and
the third sacrificial nanosheet thickness dimension.

5. The method of claim 1, wherein the fourth sacrificial nanosheet thickness dimension is substantially the same as a combined thickness of:
the second sacrificial nanosheet thickness dimension;
the second channel nanosheet thickness dimension; and
the third sacrificial nanosheet thickness dimension.

6. The method of claim 1, wherein a top surface of the third channel nanosheet over the first region of the substrate is substantially co-planar with a top surface of the third channel nanosheet over the second region of the substrate.

7. The method of claim 1, wherein the fourth sacrificial nanosheet comprises a bottom portion and a top portion.

8. The method of claim 7, wherein forming the fourth sacrificial nanosheet comprises subsequent to forming the first channel nanosheet, forming the second sacrificial nanosheet to extend over the first region of the first channel nanosheet and over the second region of the first channel nanosheet.

9. The method of claim 8, wherein the bottom portion of the fourth sacrificial nanosheet comprises a portion of the second sacrificial nanosheet that is over the second region of the first channel nanosheet.

10. The method of claim 9, wherein forming the fourth sacrificial nanosheet further comprises forming the top portion of the fourth sacrificial nanosheet over the bottom portion of the fourth sacrificial nanosheet.

11. The method of claim 10, wherein forming the top portion of the fourth sacrificial nanosheet over the bottom portion of the fourth sacrificial nanosheet comprises epitaxially growing the top portion of the fourth sacrificial nanosheet from the bottom portion of the fourth sacrificial nanosheet.

12. The method of claim 1, wherein the first sacrificial nanosheet thickness dimension is greater than the third sacrificial nanosheet thickness dimension.

13. The method of claim 1, wherein the first sacrificial nanosheet thickness dimension is greater than a combined thickness of:
the second sacrificial nanosheet thickness dimension; and
the third sacrificial nanosheet thickness dimension.

14. A method of fabricating semiconductor devices, the method comprising:

performing fabrication operations to form nanosheet field effect transistor devices on a substrate, wherein the fabrication operations include:

forming a first nanosheet transistor device and a second nanosheet transistor device on a substrate;

wherein forming the first nanosheet transistor comprises:

forming a first sacrificial nanosheet over a first region of a substrate, the first sacrificial nanosheet having a first sacrificial nanosheet thickness dimension;

forming a first channel nanosheet over the first sacrificial nanosheet and above the first region of the substrate, the first channel nano sheet having a first channel nanosheet thickness dimension;

forming a second sacrificial nanosheet over a first region of the first channel nanosheet and above the first region of the substrate, the second sacrificial nanosheet having a second sacrificial nanosheet thickness dimension;

forming a second channel nanosheet over a first region of the second sacrificial nanosheet and above the first region of the substrate, the second channel nanosheet having a second channel nanosheet thickness dimension;

forming a third sacrificial nanosheet over a first region of the second channel nanosheet and above the first region of the substrate, the third sacrificial nanosheet having a third sacrificial nanosheet thickness dimension;

forming a third channel nanosheet over a first region of the third sacrificial nanosheet and above the first region of the substrate, the third channel nanosheet having a third channel nanosheet thickness dimension;

removing the second sacrificial nanosheet, the third sacrificial nanosheet, and the portion of the first sacrificial nanosheet that is above the first region of the nanosheet;

forming a first gate oxide in the spaces that were occupied by the second sacrificial nanosheet and the portion of the first sacrificial nanosheet that is above the first region of the substrate, the first gate oxide comprising a first gate oxide thickness dimension;

wherein forming the second nanosheet transistor comprises:

forming the first sacrificial nanosheet over a second region of the substrate, the first sacrificial nanosheet having the first sacrificial nanosheet thickness dimension;

forming the first channel nanosheet over the first sacrificial nanosheet and above the second region of the substrate, the first channel nanosheet having the first channel nanosheet thickness dimension;

forming a fourth sacrificial nanosheet over a second region of the first channel nanosheet and above the second region of the substrate, the fourth sacrificial nanosheet having a second sacrificial nanosheet thickness dimension;

forming the second channel nanosheet over the second sacrificial nanosheet and above the second region of the substrate, the second channel nanosheet having a second channel nanosheet thickness dimension;

removing the fourth sacrificial nanosheet and the portion of the first sacrificial nanosheet that is above the second region of the nanosheet; and forming a second gate oxide in the spaces that were occupied by the fourth sacrificial nanosheet and the portion of the first sacrificial nanosheet that was over the second region of the substrate, the second gate oxide comprising a first gate oxide thickness dimension.

15. The method of claim 14, wherein the second gate thickness dimension is greater than the first gate thickness dimension.

16. The method of claim 14, wherein:
the second gate thickness dimension is greater than about 1 nanometer; and
the first gate thickness dimension is less than about 1 nanometer.

17. The method of claim 15, wherein:
the fourth sacrificial nanosheet thickness dimension is greater than the second sacrificial nanosheet thickness dimension; and
the fourth sacrificial nanosheet thickness dimension is greater than the third sacrificial nanosheet thickness dimension.

18. The method of claim 15, wherein the fourth sacrificial nanosheet thickness dimension is greater than a combined thickness of:
the second sacrificial nanosheet thickness dimension; and
the third sacrificial nanosheet thickness dimension.

19. A set of nanosheet field effect transistor devices formed on a substrate, the nanosheet field effect transistor devices comprising:
a first nanosheet transistor device and a second nanosheet transistor device formed on the substrate;
wherein the first nanosheet transistor comprises:
a first plurality of channel nanosheets comprising a bottommost first channel nanosheet and a topmost second channel nanosheet;
a first gate region having a first gate dielectric and a first gate metal formed therein, the first gate region having a first gate region thickness dimension; and
a second gate region having a second gate dielectric and a second gate metal formed therein, the second gate region having a second gate region thickness dimension;
wherein the second nanosheet transistor comprises:
a second plurality of channel nanosheets comprising a bottommost third channel nanosheet and a topmost fourth channel nanosheet;
a third gate region having a third gate dielectric and a first gate metal formed therein, the first gate region having a first gate region thickness dimension; and
a fourth gate region having a fourth gate dielectric and a fourth gate metal formed therein, the fourth gate region having a fourth gate region thickness dimension;
wherein:
the fourth gate region thickness dimension is greater than the second gate region thickness dimension; and
the second gate dielectric thickness dimension is greater than the first gate dielectric thickness dimension.

20. The device of claim 19, wherein a top surface of the topmost second channel nanosheet is substantially co-planar with a top surface of the topmost fourth channel nanosheet.

* * * * *